United States Patent

Kepner et al.

[15] 3,654,407

[45] Apr. 4, 1972

[54] COMPRESSION SWITCH

[72] Inventors: Theodore S. Kepner, Sunnyvale; Michael F. Miller, Los Altos, both of Calif.

[73] Assignee: Sylvania Electric Products Inc., Mountain View, Calif.

[22] Filed: June 8, 1970

[21] Appl. No.: 44,218

[52] U.S. Cl. ........................................200/86 R, 317/101 CE

[51] Int. Cl. ........................................................H01h 3/14

[58] Field of Search............200/86 R; 340/272; 317/101 CE; 339/18

[56] References Cited

UNITED STATES PATENTS 3,308,253 3/1967 Krakinowski ........................200/86 R

FOREIGN PATENTS OR APPLICATIONS 535,440 11/1955 Italy........................................200/86

*Primary Examiner*—David Smith, Jr.

*Attorney*—Norman J. O'Malley, Russell A. Cannon and John F. Lawler

[57] ABSTRACT

This matrix switch comprises rigid and flexible printed circuit boards oriented such that separated sets of parallel strip conductors on the boards extend transversely of each other, i.e., in a grid pattern. The boards are stacked such that the conductors of each set are spaced apart by a sponge rubber pad having an aperture therethrough at each crossover point on the grid of conductors. Each aperture contains a conductive element with a height less than that of the pad and having convexly curved surfaces adjacent the conductors. The switch is closed by manual pressure on the flexible board at a selected crossover point to compress the pad until the crossed conductors engage the aligned element and close the switch at that point.

1 Claim, 4 Drawing Figures

PATENTED APR 4 1972
3,654,407
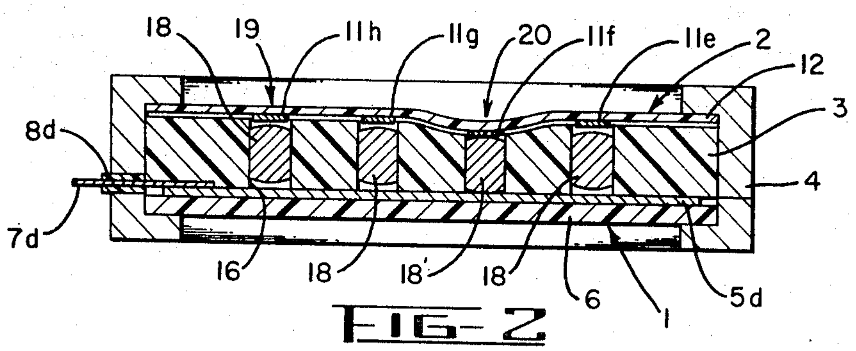
FIG-2
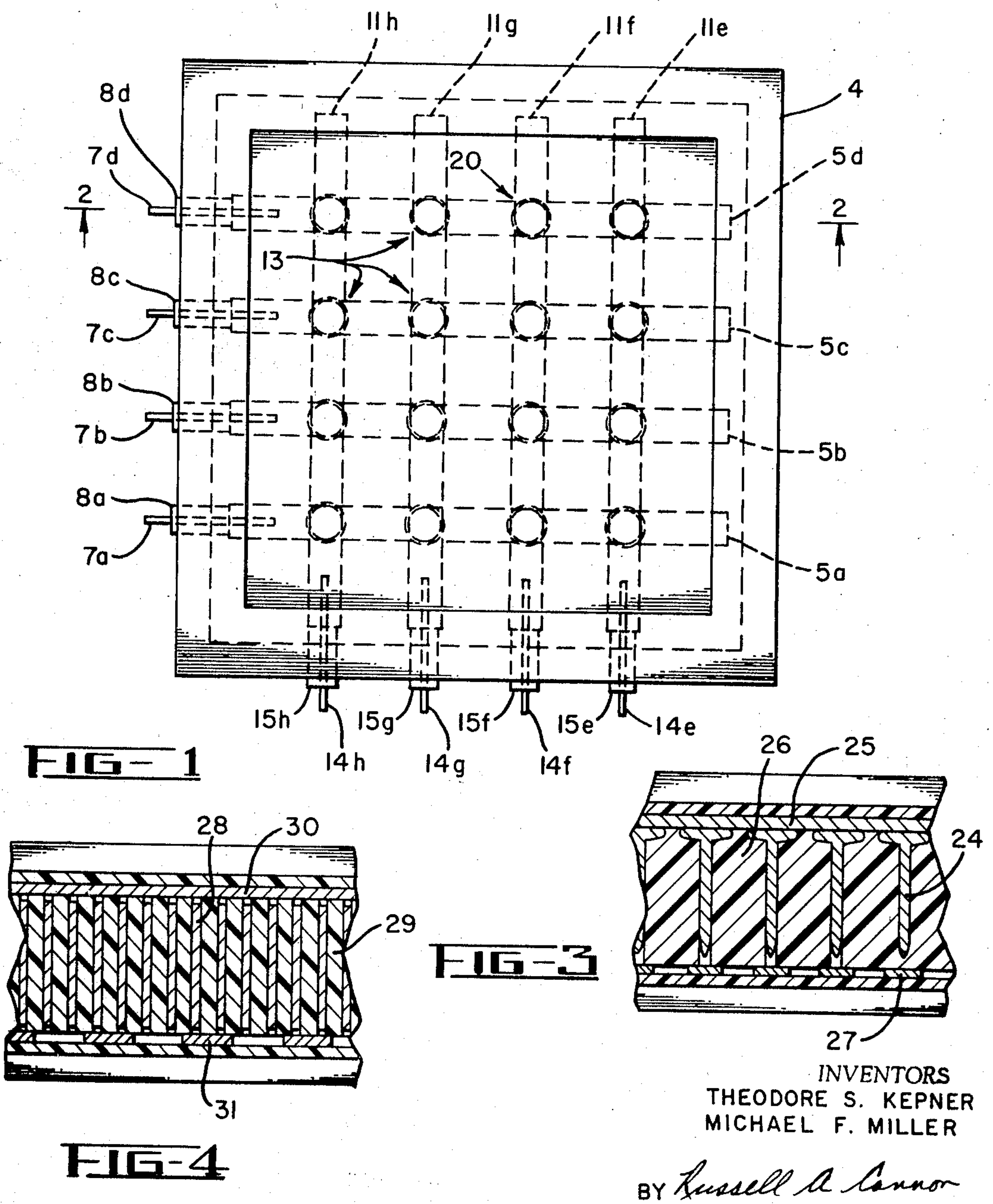
FIG-1, FIG-3
FIG-4
INVENTORS
THEODORE S. KEPNER
MICHAEL F. MILLER
BY Russell A. Connor
AGENT

COMPRESSION SWITCH

BACKGROUND OF INVENTION

This invention relates to switches and more particularly to a compression type matrix switch.

It is often desirable to be able to electrically interconnect selected pairs of a plurality of components or circuits. One mechanism for accomplishing this function is the diode matrix switch. Interconnection of components is made by selectively forward biasing a particular diode to make an electrical connection therethrough. Such a system is relatively complex and expensive. A device for manually accomplishing this function is a stacked pair of printed circuit boards each having a plurality of parallel strip conductors arranged with the conductors on one board orthogonal to and spaced from the conductors on the other board, and an aperture extending through the boards and conductors at the crossover points of the latter. Electrical connection between selected conductors and circuits connected to the ends thereof is made by physical insertion of a conductive peg through the aperture in those conductors. Such a system is too complex and expensive for use in many applications.

An object of this invention is the provision of a simple and inexpensive compression switch having normally open contacts.

DESCRIPTION OF DRAWINGS

FIG. 1 is a plan view of a matrix switch embodying this invention;

FIG. 2 is a section view taken along lines 2—2 in FIG. 1; and

FIGS. 3 and 4 are enlarged fragmentary section views of alternate embodiments of this invention.

DESCRIPTION OF PREFERRED EMBODIMENTS

Referring to FIGS. 1 and 2, a matrix switch embodying the invention comprises a pair of printed circuit boards 1 and 2 spaced apart by a dielectric pad 3 and housed in a frame 4. Circuit boards 1 and 2 preferably are flat and are in spaced parallel planes, respectively. Board 1 is preferably a rigid structure comprising a plurality of parallel strip conductors *5a*–*5d* formed on one side of a rigid dielectric sheet 6. Pins *7a*–*7d* are electrically connected to one end of the strips *5a*–*5d* , respectively, for making electrical connection to external circuitry (not shown). The pins *7a*–*7d* are insulated from the frame by dielectric spacers *8a*–*8d*, respectively.

Circuit board 2 is preferably a flexible member having a plurality of flexible parallel strip conductors *11e*–*11h* formed on the side of a flexible dielectric sheet 12 facing conductors *5a*–*5d* such that the latter are orthogonal to conductors *11e*–11 as illustrated in FIG. 1. Thus, the conductors 5 and 11 cross over each other at the points 13 as shown in FIG. 1. A crossover point is defined as the area in which a pair of conductors 5 and 11 overlap. The conductors 5 and 11 are normally electrically insulated from each other at the crossover points by the pad 3 as described more fully hereinafter. Pins *14e*–*14bq*, which are insulated from the frame by dielectric spacers *15e*–*15h*, are also connected to one end of the conductive strips *11e*–*11h*, respectively, for making electrical connection to external circuitry (not shown).

Pad 3 is preferably made of a memoryless resilient dielectric material such as sponge rubber. The pad normally electrically insulates the conductors 5 and 11 from each other, the height of the pad being equal to the spacing between these conductors when the resilient pad is relaxed, i.e., when no external compressive force is applied to the pad. An aperture 16 is formed in the pad at each crossover point. The cross sectional shape of each aperture is preferably circular, although each may also have elliptical, triangular, rectangular or other geometric forms.

A conductive element 18 such as a metallic slug is located in each of the apertures 16. The slug preferably has a diameter such that it fits snugly in the associated aperture. The height of each slug 18 is less than that of pad 3, and thus is less than the interconductor spacing, when the pad is relaxed as illustrated at 19 in FIG. 2. The surfaces of the slugs adjacent conductors 5 and 11 are preferably convexly curved.

The switch is closed at a selected crossover point 20, for example, by an operator pressing with his finger on the flexible printed circuit board 2 at the crossover point to reduce the spacing between conductors *5d* and *11f* until they contact, and make electrical connection through, slug 18'. This causes pins *7d* and *14f* to be electrically connected through conductors *5d* and *11f* and the slug 18'.

Alternatively, pad 3 may be made of a non-resilient material such as mylar. In this switch the diameters of the cylindrical apertures 16 are sufficiently large that a flexible conductor 11 deforms into an aperture to contact and make electrical connection through a slug 18 to an associated conductor 5 when an external force is applied at the associated crossover point.

Enlarged fragmentary section views of alternate embodiments of this invention that are similar to the matrix switch in FIG. 1 except for the conductive elements between the conductors are illustrated in FIGS. 3 and 4. In the switch illustrated in FIG. 3, the conductive elements are tacks 24. The heads of the tacks are rigidly secured and electrically connected to the strip conductors 25 (only one being illustrated in the drawing). The other ends of the tacks are tapered to a point for making electrical connection through resilient pad 26 to the conductors 27. It is not necessary for the tacks to be located in apertures in the resilient pad. In the switch illustrated in FIG. 4, the conductive elements are parallel conductive rods 28 extending only part way through apertures in resilient pad 29 for making electrical connection between strip conductors 30 (only one being shown in the drawing) and 31.

What is claimed is:

1. A matrix switch comprising a compressible dielectric pad, a plurality of first laterally spaced parallel conductors adjacent to one side of said pad, a plurality of second laterally spaced parallel conductors adjacent the opposite side of said pad and extending in a direction orthogonal to said first conductors whereby each of said first and second conductors overlap at a crossover point, said pad having an opening extending therethrough at each of said crossover points, and a plurality of conductive elements snugly disposed in said pad openings, respectively, each of said elements having a length less than the thickness of said pad in the relaxed state and having a cylindrical body and convexly curved ends adapted to make electrical contact with adjacent parts of said first and second conductors.

* * * * *